May 9, 1967 M. COOPERMAN 3,319,085

TUNNEL DIODE SWITCHING CIRCUIT TRIGGERABLE BY SINGLE POLARITY INPUT

Filed Nov. 25, 1964

INVENTOR.
MICHAEL COOPERMAN

BY John V. Regan

Attorney 3,319,085

TUNNEL DIODE SWITCHING CIRCUIT TRIGGERABLE BY SINGLE POLARITY INPUT

Michael Cooperman, Cherry Hill, N.J., assignor to Radio Corporation of America, a corporation of Delaware Filed Nov. 25, 1964, Ser. No. 413,766
9 Claims. (Cl. 307—88.5)

This invention relates to switching circuits and, in particular, to triggerable flip-flop circuits employing negative resistance diodes, such as tunnel diodes.

A tunnel diode is a two-terminal device having a forward volt-ampere characteristic defined by first and second regions of positive resistance at relatively low and high voltage values, respectively, and a region of negative resistance connecting the two regions of positive resistance. As is known, a tunnel diode may be biased bistably in either the low voltage or high voltage state of positive resistance. Also, a tunnel diode can be switched from one state to the other at very high speed. Because the device has only two terminals and operates over a relatively small voltage range, it is generally not practical to cross-couple two such devices to form a flip-flop, especially a flip-flop that can be triggered successfully with pulses of a single one polarity.

It is one object of this invention to provide a high speed switching circuit employing tunnel diodes.

It is another object of this invention to provide a triggerable flip-flop that employs a pair of tunnel diodes.

It is still another object of this invention to provide a triggerable flip-flop employing two tunnel diodes, in which the flip-flop may be triggered successively and unconditionally in response to input signals of a single one polarity applied at one point in the circuit.

Briefly stated, the invention comprises a pair of negative resistance diodes, preferably tunnel diodes, connected in a series between a pair of junction points and being poled in the same direction. The diodes are quiescently biased so that only one of the tunnel diodes is operable in a steady state of high voltage. A transistor has its emitter operatively coupled to one of the junction points and has its base connected to a node on the series connection between the diodes. The collector is connected to the latter node, and the transistor is of such conductivity type that a current $I_1$ flows in the latter connection in a first polarity direction, relative to the node, in one state of the circuit. A substantially constant current means is connected at the node and supplies a current $I_2 < I_1$ in the opposite direction relative to the node. The flip-flop is triggered by applying a pulse across the two junction points.

Figure 1:
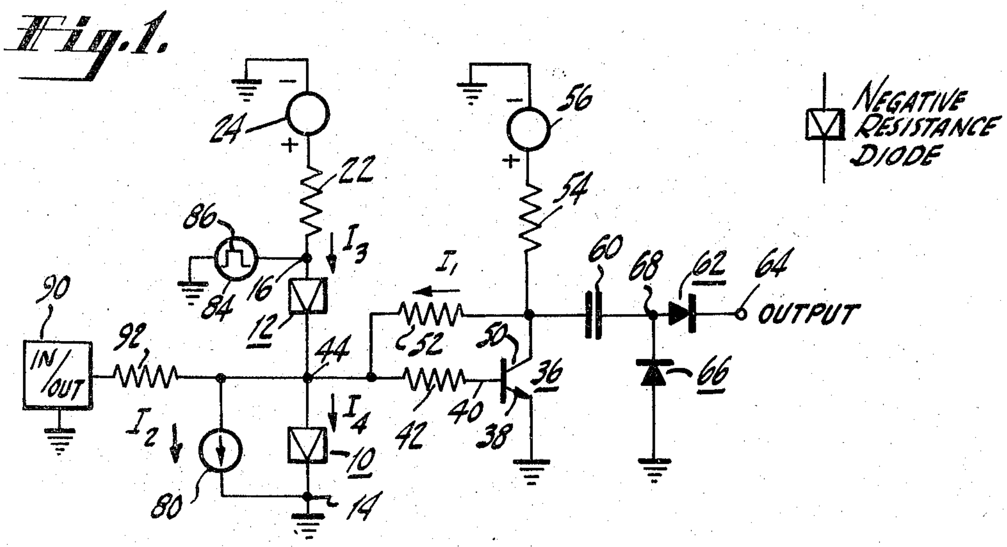

In the accompanying drawing, like reference characters denote like components; and FIGURE 1 is a schematic diagram of a triggerable flip-flop embodying the invention.

Figure 2:
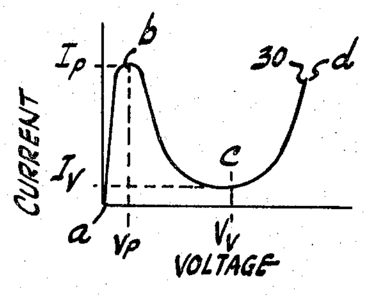
Figure 3:
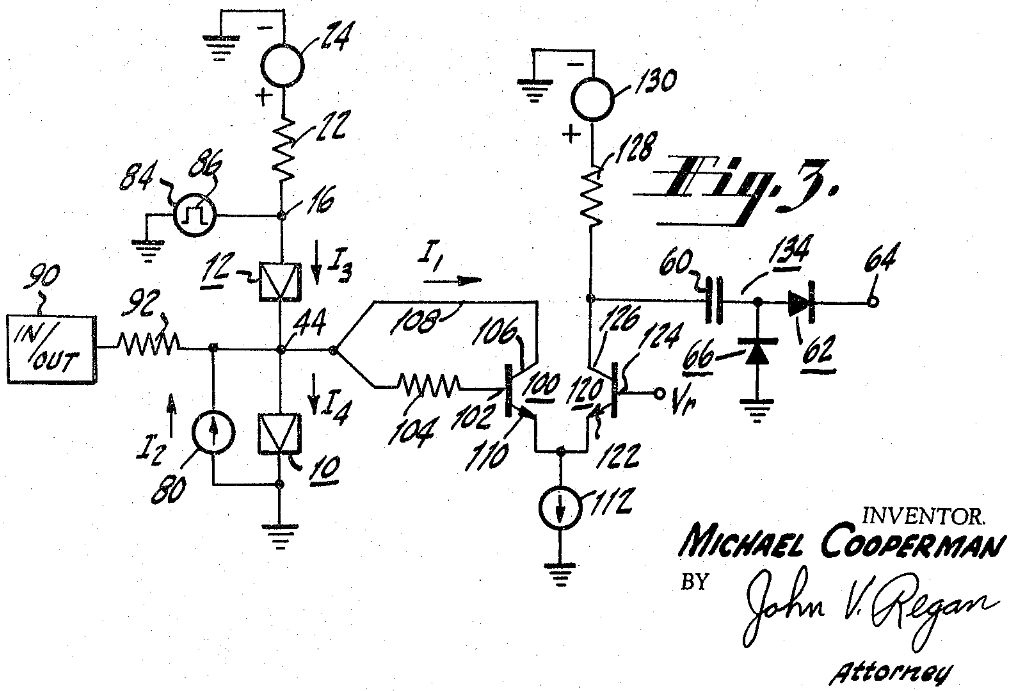

FIGURE 2 is a forward volt-ampere characteristic of a negative resistance diode suitable for practicing the invention; and FIGURE 3 is a schematic diagram of another triggerable flip-flop embodying the invention.

In FIGURE 1, first and second negative resistance diodes 10, 12 are serially connected between a pair of junction points 14, 16, with the diodes poled in the same direction. The diodes 10, 12 are bistably biased by the combination of a resistor 22 and a source 24 of bias potential connected in series between junction point 16 and junction point 14. In particular, bias source 24, which may be a battery for example, has its positive terminal connected to the resistor 22 and has its negative terminal grounded. The junction point 14 also is connected to circuit ground.

The diodes 10, 12 are ones which have a forward volt-ampere characteristic 30 of the general type illustrated in FIGURE 2, and preferably are tunnel diodes. The diode operating characteristic 30, for forward diode current, has a first region *ab* of positive resistance that extends over a range of relatively low voltage values, and a second region *cd* of positive resistance that extends over a range of relatively high voltage values. Intermediate the two positive resistance regions is a region *bc* of negative resistance. As is known, a tunnel diode may be bistably biased so that the diode's operating point can lie along either of the positive resistance regions *ab* or *cd* quiescently.

A diode biased in the low voltage region *ab* may be switched to the high voltage region *cd* by increasing the diode current above a value $I_p$, corresponding to the peak *b* on the characteristics 30. A diode stably biased in the high voltage state is switched back to the low voltage state by reducing the diode current below a value $I_v$, corresponding to the valley point *c* on characteristic 30. As may be seen in FIGURE 2, the voltage across the terminals of a tunnel diode has a value greater than $V_v$, the voltage at the valley point *c*, when the tunnel diode is biased in the high voltage region *cd*. In FIGURE 1, the source 24 and resistor 22 are selected in value, in known fashion, so that the quiescent voltage across the series diodes has a value greater than $V_v$ and less than $2V_v$, whereby only one of the diodes is biased quiescently in the high voltage state, while the other diode is biased in the low voltage region *ab*.

A transistor 36, illustrated as an NPN type transistor, has an emitter 38 connected to circuit ground and has a base 40 connected by way of a resistor 42 to a node 44 on the series connection between the diodes 10, 12. In some cases, it may be desirable or necessary to connect emitter 38 to a source of potential other than ground, as when the transistor is silicon and the tunnel diode 10 is germanium. The collector 50 is connected by way of a resistor 52 to the node 44 and is also connected by way of another resistor 54 to the positive terminal of a source 56 of suitable operating potential. Source 56, which may be a battery for example, has its negative terminal grounded. A capacitor 60 and a first unidirectional conducting device 62, illustrated as a conventional diode, are serially connected between the collector 50 and an output terminal 64. A second, conventional diode 66 is connected between the junction 68 of capacitor 60 and diode 62 and circuit ground. Diode 66 is poled in a direction to prevent the voltage at point 68 from becoming less positive than approximately ground potential, whereby negative signals coupled through capacitor 60 are shorted to ground. Diode 62 is poled in a direction to pass positive going signals coupled to junction 68 by the capacitor 60.

For reasons to be described hereinafter, a current $I_1$ flows from source 56 through resistors 52 and 54 to the node 44 when the transistor is nonconducting. A substantially constant current means 80, which may be a current source, for example, is connected between node 44 of the diode circuit and circuit ground. Current means 80 causes a substantially constant current $I_2$ to flow away from the node 44. This current $I_2$ is chosen to have a value which is less than the current $I_1$, and to flow in an opposite direction to the current $I_1$ relative to node 44.

Trigger input signals 86 are selectively applied to the circuit by signal input means 84 connected between the junction point 16 and circuit ground. The trigger input signals 86 are illustrated as having a polarity to increase the forward current flowing through the diodes 10 and 12 and, as will become apparent from a later description, preferably have a duration which is less than the switching time of the transistor 36. These pulses may originate, for example, at the output terminal 64 of another trigger flip-flop (not shown). Alternatively, these trigger input pulses could have a polarity to decrease the current flowing through the diodes 10, 12.

Input signals for switching the flip-flop to a given state also may be applied to the circuit from a device 90 which is connected by means of a resistor 92 to node 44. Alternatively, the device 90 can be an output device for sampling the state of the flip-flop.

Consider now the operation of the triggerable flip-flop, and let it be assumed that each of the diodes 10, 12 has approximately the same peak current $I_p$ (FIGURE 2). As mentioned previously, the source 24 voltage and resistor 22 are selected so that one of the diodes is biased in the high voltage state and the other diode is biased in the low voltage state quiescently. When the lower diode 10 is in the low voltage state, the voltage at node 44 is less than $V_p$ volts (FIGURE 2) which may be of the order of 50 to 100 millivolts, depending on the diode. Transistor 36 is biased in a nonconducting condition at this time and a current $I_1$ flows, in the conventional sense, from the positive terminal of voltage source 56 and through resistors 54 and 52 to the node 44. A second current $I_3$ flows from the positive terminal of voltage source 24 through upper diode 12 to the node 44. At the same time, a substantially constant current $I_2<I_1$ flows out of the node 44 and through the constant current means 80 to circuit ground. The remaining current $I_4$ flows out of the node 44 and through lower diode 10 to ground. By means of the standard nodal equation, it may be seen that $I_3=I_4-(I_1-I_2)$. Since $I_1$ is greater than $I_2$, the current $I_3$ flowing through upper diode 12 is less than the current $I_4$ flowing through lower diode 10.

Assume first that the trigger pulse 86 applied at junction 16 has a polarity to increase the current flowing through both of the diodes 10 and 12. The amplitude of this pulse 86 is chosen so that the diode 10 current is increased above the peak value $I_p$ (FIGURE 1), thereby switching lower diode 10 to the high voltage state. Upon the termination of the trigger pulse 86, the currents flowing through the diodes 10 and 12 decrease in value. Since $I_3$ is less than $I_4$, the upper tunnel diode 12 switches to the low voltage state because only one of the diodes 10, 12 can be in the high voltage state for any quiescent condition. For proper switching action the current $I_1$ flowing through resistor 52 must be prevented from changing substantially until the upper tunnel diode 12 is switched to the low voltage state. Specifically, $I_1$ must not fall close to, or less than, $I_2$ during the switching transient. This is accomplished if the transistor 36 has a turn-on time of longer duration than the fast switching time of a tunnel diode. Also capacitor 60 delays the change in $I_1$. Trigger pulse 86 is chosen to have a duration that is shorter than the total delay aforementioned, and preferably terminates before the transistor 36 turns on.

When tunnel diode 10 is in the high voltage state, the voltage at node 44 has a value greater than $V_v$ (FIGURE 2), which value again is a function of the particular diode. In any event, the diode 10 is one having a characteristic such that the voltage at node 44 is sufficiently high to bias transistor 36 in a conducting condition when the diode 10 is in the high voltage state. Preferably, the voltage at node 44 is sufficient to bias the transistor 36 in saturation. Under these conditions, the voltages at node 44 and at collector 50 are close in value and very little current, if any, flows through resistor 52. When transistor 36 first turns on, the voltage at collector 50 falls from some positive value to a value close to ground potential. A negative pulse is coupled by capacitor 60 to the junction 68. Diode 66 is poled in a direction to prevent the voltage at junction 68 from going less positive than approximately ground potential, whereby this negative pulse is shunted through diode 66 to circuit ground, and no change appears at output terminal 64.

With no current $I_1$ flowing through resistor 52 to the node 44, and neglecting the small base 40 current, $I_3=I_2+I_4$. Thus, the current $I_3$ flowing through upper diode 12 is greater in magnitude than the current $I_4$ flowing through diode 10. When the next positive going trigger pulse 86 is applied at junction 16, the current through both of the diodes 10 and 12 is increased. The amplitude of pulse 86 is sufficient to increase the current through diode 12 above the peak value $I_p$, whereby upper diode 12 switches to the high voltage state. Upon termination of this pulse 86, the currents through both of the diodes 10, 12 decrease in value. Lower diode 12 switches back to the low voltage state since its current $I_4$ is less than the current $I_3$ in upper diode 12. The turn-off time of the transistor 36, especially in a saturated transistor, is longer than the switching time of the tunnel diode 10, whereby there is little or no change in the current flowing through resistor 52 during the switching period.

When lower diode 10 has been switched to the low voltage state, the voltage at node 44 falls close to ground potential and transistor 36 turns off after a delay. The voltage at collector 50 then rises in a positive direction and a positive signal is coupled by capacitor 60 to the junction 68. Diode 66 is reverse biased by this signal and the other diode 62 becomes forward biased, whereby a positive signal appears at the output terminal 64. This output signal may be applied as a trigger input signal to another, similar trigger circuit in a counter application.

A second output may be derived directly at the node 44 if desired. For example, the box 90 may be a suitable output device connected by way of the resistor 92 to the node 44. In this event, the input to the device 90 is a level rather than a pulse as in the case of the output terminal 64. Also, a signal is applied to the device 90 at all times, regardless of the state of the trigger circuit, whereas a signal appears at output terminal 64 only for a short period when the tunnel diode 10 is switched to the low voltage state.

It will also be apparent that the box 90 may be an input device for selectively applying a signal at the node 44 to switch the triggerable flip-flop into a desired state. For example, a positive signal supplied by device 90 increases the current flowing through lower diode 10 and decreases the current flowing through upper diode 12. If the input is of sufficient magnitude, the lower diode 10 will be switched to the high voltage state. On the other hand, a negative signal provided by device 90 will decrease the current to lower diode 10 and increase the current flowing through upper diode 12, whereby the upper diode 12 may be switched to the high voltage state.

As mentioned previously, the circuit also can be triggered by negative going pulses supplied by the signal input means 84. Consider the case where lower diode 10 is in the low voltage state and transistor 36 is non-conducting. The current $I_3$ flowing through upper diode 12 is less than the current $I_4$ through lower diode 10; specifically, $I_3=I_4-(I_1-I_2)$. When a negative trigger pulse is applied at junction 16, the current through both diodes 10, 12 decreases. If the pulse is of sufficient magnitude, the current through upper diode 12 will decrease below $I_v$ (FIGURE 2), and upper diode 12 will switch to the low voltage region. Both diodes 10, 12 will then be temporarily in the low voltage state. Upon termination of the trigger pulse, the current through both diodes increases. Diode 10 then will switch to the high voltage state since it has a larger current than upper diode 12.

In the quiescent condition with lower diode 10 in the high voltage state and the transistor 36 conducting, $I_3=I_2+I_4$. A large negative trigger pulse applied at junction 16 will switch lower diode 10 to the low voltage state. At the termination of this trigger pulse, the current through both diodes 10, 12 increases. Upper diode 12 will switch to the high voltage state because its current $I_3$ is greater than the current $I_4$ through lower diode 10.

If negative trigger pulses are to be employed, and it is desired to cascade trigger stages, the connections to each of the diodes 62 and 66 in the output network should be revised. This will result in positive signals passed by the capacitor 60 being shorted to ground through the shunt diode 66. Negative signals passed by capacitor 60 will revise bias diode 66 and pass through diode 62 to the output terminal 64. These output pulses have the proper polarity to trigger the next stage.

The triggerable flip-flop illustrated in FIGURE 3 has a tunnel diode arrangement which is similar to the diode arrangement in FIGURE 1, and like components are identified by like reference characters. In FIGURE 3, however, the constant current means 80 is poled in the opposite direction to cause a constant current $I_2$, in the conventional sense, to flow toward the node 44.

A first transistor 100, illustrated as an NPN type transistor, has a base 102 connected by way of a resistor 104 to the node 44. Its collector 106 is connected by way of a direct current connection, illustrated as a lead 108, to node 44. The emitter 110 is connected to one terminal of a source 112 of substantially constant current, the other terminal of the source 112 being grounded. A second transistor 120 of like conductivity type has its emitter 122 connected directly to the emitter 110 of the first transistor 100, and has its base 124 connected to a source (not shown) of fixed bias potential $V_r$. The collector 126 of this transistor is connected by way of a supply resistor 128 to the positive terminal of a source 130 of suitable operating potential. Source 130, which may be a battery for example, has its negative terminal grounded. An output network 134, similar to the output network in FIGURE 1, is connected at the collector 126.

The pair of transistors 100, 120 functions in a well-known manner as a current steering circuit. That is to say, when the voltage $V_r$ at base 124 is more positive than the voltage at base 102, all of the current from the source 112 is steered into the second transistor 120. On the other hand, when the voltage at the base 102 of transistor 100 is more positive than the fixed voltage $V_r$, all of the source 112 current is steered into the first transistor 110. Fixed bias $V_r$ is chosen to have a value between the two values of voltage at node 44 representing the two stable states of the circuit. For example, $V_r$ may have a value which lies approximately midway between the voltages $V_v$ and $V_p$ (FIGURE 2).

Consider now the operation of the FIGURE 3 circuit. Let it be assumed that the lower tunnel diode 10 is in the low voltage state and that the upper tunnel diode 12 is in the high voltage state. The voltage at node 44 then has the lower (less positive) of its two possible steady state values. Trigger 100 is biased in a nonconducting condition, and all of the current from source 112 flows through the second transistor 120. The collector 106 current is essentially zero because of the non-conducting condition of the transistor 100, whereby $I_4=I_2+I_3$. Thus, the quiescent current $I_4$ flowing through lower diode 10 is greater than the current $I_3$ flowing through upper diode 12.

A positive going trigger input pulse 86 increases the current through both of the diodes 10, 12 and switches lower diode 10 to the high voltage state. Upon termination of the pulse 86, the currents through the diodes decrease, and upper diode 12 switches to the low voltage state because its current is less than the current through lower diode 10.

The voltage at node 44 now has the more positive value of its two positive steady state values. Base 102 of transistor 100 is now more positive than the reference voltage $V_r$ applied at base 124, whereby all of the source 112 current flows through transistor 100, and transistor 120 turns off. The positive rise in voltage at collector 126 is coupled by capacitor 60 and the diode 62 to output terminal 64.

With transistor 100 in conduction, a current $I_1$ flows, in the conventional sense, from node 44 to the collector 106. The magnitude of this current is determined by the source 112 and the transistor 100 characteristic, and is selected to be of greater magnitude than the current $I_2$ flowing into the node 44 from the constant current means 80. For this condition, $I_3=I_4+(I_1-I_2)$ and, since $I_1>I_2$, the current $I_3$ in upper diode 12 is greater than the current $I_4$ flowing through lower diode 10.

The next applied trigger pulse 86 increases the currents through the diodes 10, 12 and switches upper diode 12 to the high voltage state. Upon termination of the pulse 86, the diode currents decrease and lower tunnel diode 10 switches to the low voltage state because its current is less than the current through upper diode 12. The voltage at node 44 falls to its less positive value, transistor 100 turns off, and second transistor 120 conducts. The flow of current through collector resistor 128 causes the voltage at collector 126 to fall in value. A negative going signal is coupled through capacitor 60 and is shunted to ground by the now forward biased diode 66, whereby no change in output appears at output terminal 64.

As in the case of the FIGURE 1 circuit, the state of the trigger circuit may be sampled by a device 90 connected through a resistor 92 to the node 44. Also, the flip-flop can be switched to a desired state if the device 90 is an input pulse source providing pulses of suitable amplitude and polarity. Further, the circuit can be triggered by negative input pulses applied at junction 16.

Although the circuits have been described and illustrated as employing NPN type transistors, it will be apparent to one skilled in the art that PNP type transistors also could be used, provided that the connections to the various bias sources are reversed and provided further that the connections to the tunnel diodes 10 and 12 also are reversed. Also, the direction of the constant current $I_2$ should be reversed.

What is claimed is:

1. The combination comprising:

a pair of negative resistance diodes connected in series and being poled in the same direction;

each of said diodes having a forward volt-ampere characteristic defined by a first region of positive resistance at relatively low voltage, a second region of positive resistance at relatively high voltage, and a region of negative resistance joining the two regions of positive resistance;

means for applying a forward voltage across said diodes to bistably bias said diodes, said voltage having such a value that only one of the diodes can be biased in the second region of positive resistance for any quiescent operating condition;

a transistor having an emitter-base junction connected in a path across one of the diodes, and having a collector;

means connecting said collector to a point on the series connection between said diodes, said transistor being of such conductivity type that a current $I_1$ flows in the connecting means in a first direction relative to said point when said one of said diodes is biased in a first of its two stable states;

substantially constant current means connected at said point and supplying a current $I_2<I_1$ in a second, opposite direction relative to said point; and signal input means connected across said diodes.

2. The combination comprising:

a pair of negative resistance diodes connected in series and being poled in the same direction;

each of said diodes having a forward volt-ampere characteristic defined by a first region of positive resistance at relatively low voltage, a second region of positive resistance at relatively high voltage, and a region of negative resistance joining the two regions of positive resistance;

means for applying a forward voltage across said diodes to bistably bias said diodes, said voltage having such a value that only one of the diodes can be biased in the second region of positive resistance for any quiescent operating condition;

a transistor having an emitter-base junction connected in a path across one of the diodes, and having a collector;

means connecting said collector to a point on the series connection between said diodes, said transistor being of such conductivity type that a current $I_1$ flows in the connecting means in a first direction relative to said point when said one of said diodes is biased in a first of its two stable states;

substantially constant current means connected at said point and supplying a current $I_2<I_1$ in a second, opposite direction relative to said point; and signal input means connected across said diodes and providing signals each having a duration shorter than the switching time of said transistor.

3. The combination comprising:

a pair of negative resistance diodes connected in series and being poled in the same direction;

each of said diodes having a forward volt-ampere characteristic defined by a first region of positive resistance at relatively low voltage, a second region of positive resistance at relatively high voltage, and a region of negative resistance joining the two regions of positive resistance;

means for applying a forward voltage across said diodes to bistably bias said diodes, said voltage having such a value that only one of the diodes can be biased in the second region of positive resistance for any quiescent operating condition;

a transistor having an emitter-base junction connected in a path across one of the diodes, and having a collector;

means connecting said collector to a point on the series connection between said diodes, said transistor being of such a conductivity type that a current $I_1$ flows in the connecting means in a first direction relative to said point when said one of said diodes is biased in its first region of positive resistance;

substantially constant current means connected at said point and supplying a current $I_2<I_1$ in a second, opposite direction relative to said point; and signal input means connected across said diodes.

4. The combination comprising:

a pair of negative resistance diodes connected in series and being poled in the same direction;

each of said diodes having a forward volt-ampere characteristic defined by a first region of positive resistance at relatively low voltage, a second region of positive resistance at relatively high voltage, and a region of negative resistance joining the two regions of positive resistance;

means for applying a forward voltage across said diodes to bistably bias same, said voltage having such a value that only one of the diodes can be biased in the second region of positive resistance for any quiescent operating condition;

a transistor having an emitter-base junction connected in a path across one of the diodes, and having a collector;

means connecting said collector to a point on the series connection between said diodes, said transistor being of such a conductivity type that a current $I_1$ flows in the connecting means in a first direction relative to said point when said one of said diodes is biased in its first region of positive resistance;

substantially constant current means connected at said point and supplying a current $I_2<I_1$ in a second, opposite direction relative to said point; and signal input mean connected across said diodes and providing input signals having a duration shorter than either one of the turn-on and turn-off times of said transistor.

5. The combination comprising:

a pair of tunnel diodes connected in series between a point of reference potential and a second point, and being poled in the same direction;

means for applying a forward voltage between said second point and said point of reference potential, said voltage having such a value that one diode is biased in a stable state of high voltage and the other diode is biased in a stable state of low voltage quiescently;

a transistor having a base, a collector and an emitter;

first means connecting said emitter to said point of reference potential;

second and third means connecting said base and collector, respectively, to a node on the series connection between said diodes;

said transistor being of such conductivity type that a current $I_1$ flows in said third means in a first direction relative to said node when a given one of said diodes is biased in the high voltage state;

means connected at said node and supplying a current $I_2<I_1$ in a second, opposite direction relative to said node; and signal input means connected at said second point.

6. The combination comprising:

a pair of tunnel diodes connected in series between a point of reference potential and a second point, and being poled in the same direction;

means for applying a forward voltage between said second point and said point of reference potential, said voltage having such a value that one diode is biased in a stable state of high voltage and the other diode is biased in a stable state of low voltage quiescently;

a transistor having a base, a collector and an emitter;

first means connecting said emitter to said point of reference potential;

second and third means connecting said base and collector, respectively, to a node on the series connection between said diodes;

said transistor being of such conductivity type that a current $I_1$ flows in said third means in a first direction relative to said node when a given one of said diodes is biased in the high voltage state;

means connected at said node and supplying a current $I_2<I_1$ in a second, opposite direction relative to said node;

signal input means connected at said second point; and output means connected at said node.

7. The combination comprising:

a pair of tunnel diodes connected in series between a point of reference potential and a second point, and being poled in the same direction;

means for applying a forward voltage between said second point and said point of reference potential, said voltage having such a value that one diode is biased in a stable state of high voltage and the other diode is biased in a stable state of low voltage quiescently;

a transistor having a base, a collector and an emitter;

first means connecting said emitter to said point of reference potential;

second and third means connecting said base and collector, respectively, to a node on the series connection between said diodes;

said transistor being of such conductivity type that a current $I_1$ flows in said third means in a first direction relative to said node when a given one of said diodes is biased in the high voltage state;

means connected at said node and supplying a current $I_2<I_1$ in a second, opposite direction relative to said node;

signal input means connected at said second point; and output means connected at said collector.

8. The combination comprising:

a pair of tunnel diodes connected in series between a point of reference potential and a second point, and being poled in the same direction;

means for applying a forward voltage between said second point and said point of reference potential, said voltage having such a value that one diode is biased in a stable state of high voltage and the other diode is biased in a stable state of low voltage quiescently;

a transistor having a base, a collector and an emitter;

first means connecting said emitter to said point of reference potential;

second and third means connecting said base and collector, respectively, to a node on the series connection between said diodes;

a resistor having one terminal connected to said collector, and means for applying operating potential between the other terminal of said resistor and said point of reference potential;

said transistor being of such conductivity type that a current $I_1$ flows in said third means in a first direction relative to said node when a given one of said diodes is biased in the high voltage state;

means connected at said node and supplying a current $I_2 < I_1$ in a second, opposite direction relative to said node; and signal input means connected at said second point.

9. The combination comprising:

first and second tunnel diodes connected in series, in the order named, between a point of reference potential and a second point, said diodes being poled in the same direction;

means for applying operating potential across said diodes having such a value that one diode is stably biased in a high voltage state and the other diode is stably biased in a low voltage state quiescently;

a first transistor having an emitter, a base and a collector;

substantially constant current means connected between said emitter and said point of reference potential;

means connecting said base to a third point on the series connection between said diodes;

a direct current connection between said third point and said collector;

a second transistor of the same conductivity type having an emitter connected to the emitter of the first transistor, a base connected to a point of fixed potential and a collector;

output means connected at the collector of said second transistor;

said transistors being of such conductivity type that a current $I_1$ flows in said direct current connection in a first direction relative to said third point when said first transistor conducts;

substantially constant current means connected at said third point and supplying current $I_2 < I_1$ in a second direction, opposite said first direction, relative to said third point; and signal input means connected at said second point.

No references cited.

DAVID J. GALVIN, *Primary Examiner.*

B. P. DAVIS, *Assistant Examiner.*